(12) United States Patent
Hung et al.

(10) Patent No.: US 7,245,028 B2
(45) Date of Patent: Jul. 17, 2007

(54) SPLIT CONTROL PAD FOR MULTIPLE SIGNAL

(75) Inventors: Chi-Cheng Hung, Hsinchu (TW); Ling-Yueh Chang, Hsinchu (TW)

(73) Assignee: Lyontek Inc., Hsinchu (TW)

( * ) Notice: Subject to any disclaimer, the term of this patent is extended or adjusted under 35 U.S.C. 154(b) by 89 days.

(21) Appl. No.: 11/141,792

(22) Filed: Jun. 2, 2005

(65) Prior Publication Data

US 2007/0018271 A1    Jan. 25, 2007

(51) Int. Cl.
*H01L 23/48* (2006.01)
(52) U.S. Cl. .................. 257/786; 257/665; 257/690
(58) Field of Classification Search ............... 257/665, 257/459, 786
See application file for complete search history.

(56) References Cited

U.S. PATENT DOCUMENTS 5,623,160 A * 4/1997 Liberkowski ............... 257/621
6,229,206 B1 * 5/2001 Schamberger et al. ...... 257/690

FOREIGN PATENT DOCUMENTS

EP          0410595 A2 *  5/1991  ...................... 3/18

* cited by examiner

*Primary Examiner*—Zandra V. Smith
*Assistant Examiner*—Paul E Patton
(74) *Attorney, Agent, or Firm*—H. C. Lin, Patent Agent

(57) ABSTRACT

A control pad is split into two sections for output one of three signals selected from the group consisted of 00, 01, and 11 on an integrated circuit. Each section is internally connected to different voltage sources, say Vdd which represents logical "1", or Vss which represents logical "0", so that a default output is 1,0. When the split control pad is bonded with outside Vdd or Vss, both sections output "1,1" or "0,0" respectively. One of three possible logic word combinations can be selected to use for an IC.

5 Claims, 5 Drawing Sheets

(a)

(b)

Table 1A. Prior Art

|  | Single Pad in the Prior Art |
|---|---|
| Coupling to Vdd | Signal 1 |
| Coupling to Vss | Signal 0 |

Table 1B

|  |  | Split Pad (L, R Half) | Status |
|---|---|---|---|
| Default | Split Pad without bonding, L coupling to Vdd, R coupling to Vss | Signal 1, 0 | S2 |
| Selection 1 | Split Pad wire bonding to Vdd | Signal 1, 1 | S1 |
| Selection 2 | Split Pad wire bonding to Vss | Signal 0, 0 | S0 |

SPLIT CONTROL PAD FOR MULTIPLE SIGNAL

BACKGROUND OF THE INVENTION

1. Filed of the Invention

This invention is related to bonding pads of an integrated circuit, particularly to the control pad of a digital integrated circuit.

2. Brief Description of Related Art

FIG. 1 shows the layout of bonding pads of a prior art digital integrated circuit (IC)10. There are a plurality of input/output (I/O) pads 17 for an IC. Here in FIG. 1, only two I/O pads are shown as an example. A control pad 11 is shown to offer multi-functional definition. The signal for the conventional control pad is either logical "1" customarily coupled to the positive supply voltage Vdd for positive logic as shown in FIG. 1(a), or logical "0" coupled to the negative supply voltage Vss as shown in FIG. 1(b). The status of the conventional control pad is tabulated in Table 1A. The conventional control pad is either connected to Vdd or connected to Vss.

SUMMARY OF THE INVENTION

An object of the present invention is to furnish more than two control signals from a split control pad that occupies only a single pad area. Another object of the invention is to use one or more control pad as a decoder.

These objects are achieved by splitting a control pad into two sections. One section is connected to Vdd through a first high resistance, and supplies internal signal 1. A second section is connected to Vss through a second high resistance, and supplies internal signal 2.

When the control pad is not bonded, the first section is pulled up to Vdd and the second section is pulled down to Vss, and internal signal 1 and signal 2 represent as (1,0).

When a logical "1" is bonded to both sections with a single bonding bump, the internal signal 1 and signal 2 represent logic (1,1). When a logical "0" is bonded to both sections with a single bonding bump, the internal signal 1 and signal 2 represent logic (0,0).

More than one split control pad can be designed in for a longer than two bit digital word to be decoded.

DETAILED DESCRIPTION OF THE INVENTION

Figure 1:
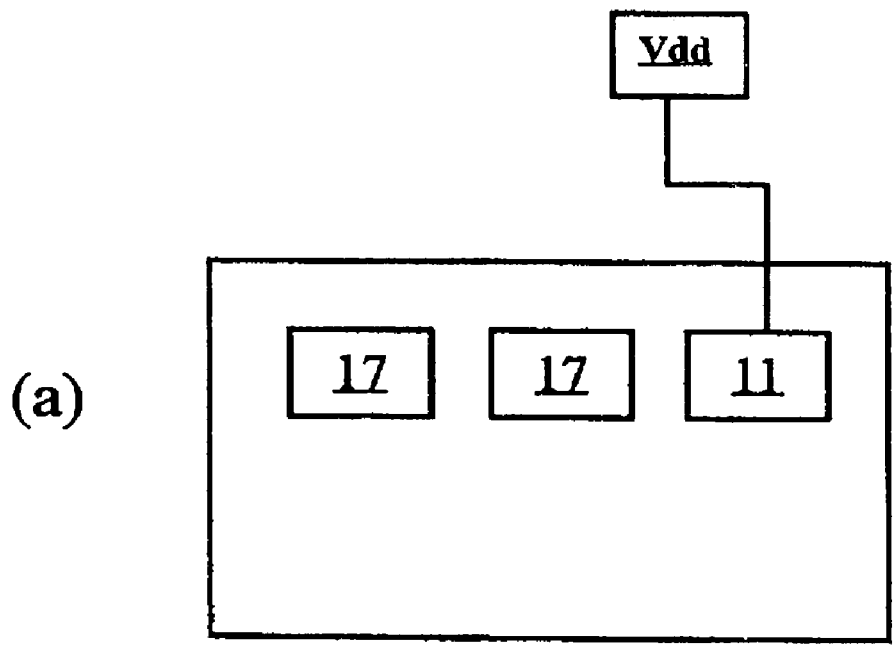
FIG. 1(a) shows a prior art with one control pad bonding to Vdd.
FIG. 1(b) shows the prior art with the control pad bonding to Vss
Figure 1:
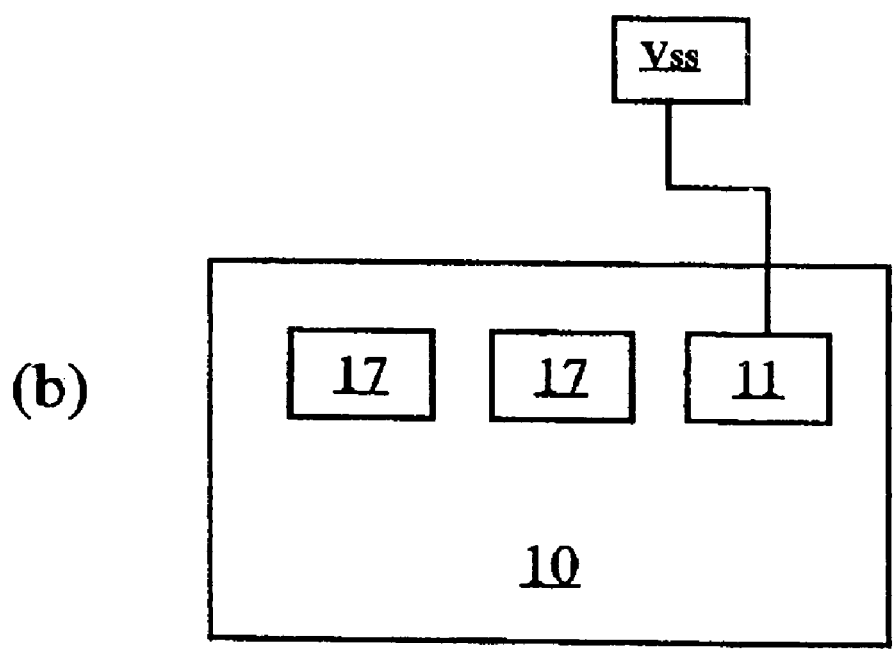
Figure 2:
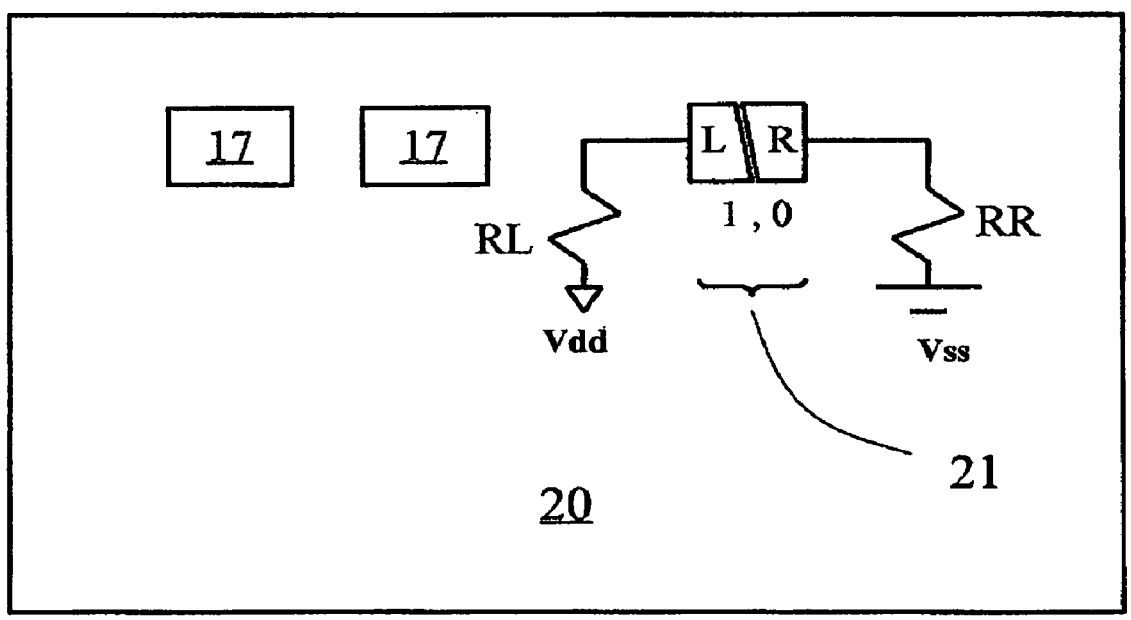
FIG. 2 shows the split control pad of the present invention to preset to (1,0) by high resistance circuit.

FIG. 2 shows the first embodiment of the present invention. A control pad 21 that occupies substantially the same area of the other pad, is located on an IC chip 20. The control pad 21 is split into a left section L and a right section R. The L section is internally connected to a positive supply voltage Vdd through a resistor RL, say the left hand one. The R section is internally connected to a negative supply voltage Vss through a second resistor RR, say the right hand one. In this configuration, two sections of the split control pad 21 are impressed with logical word "1,0". This status is denoted as S2, Default in Table 1B.

Figure 3:
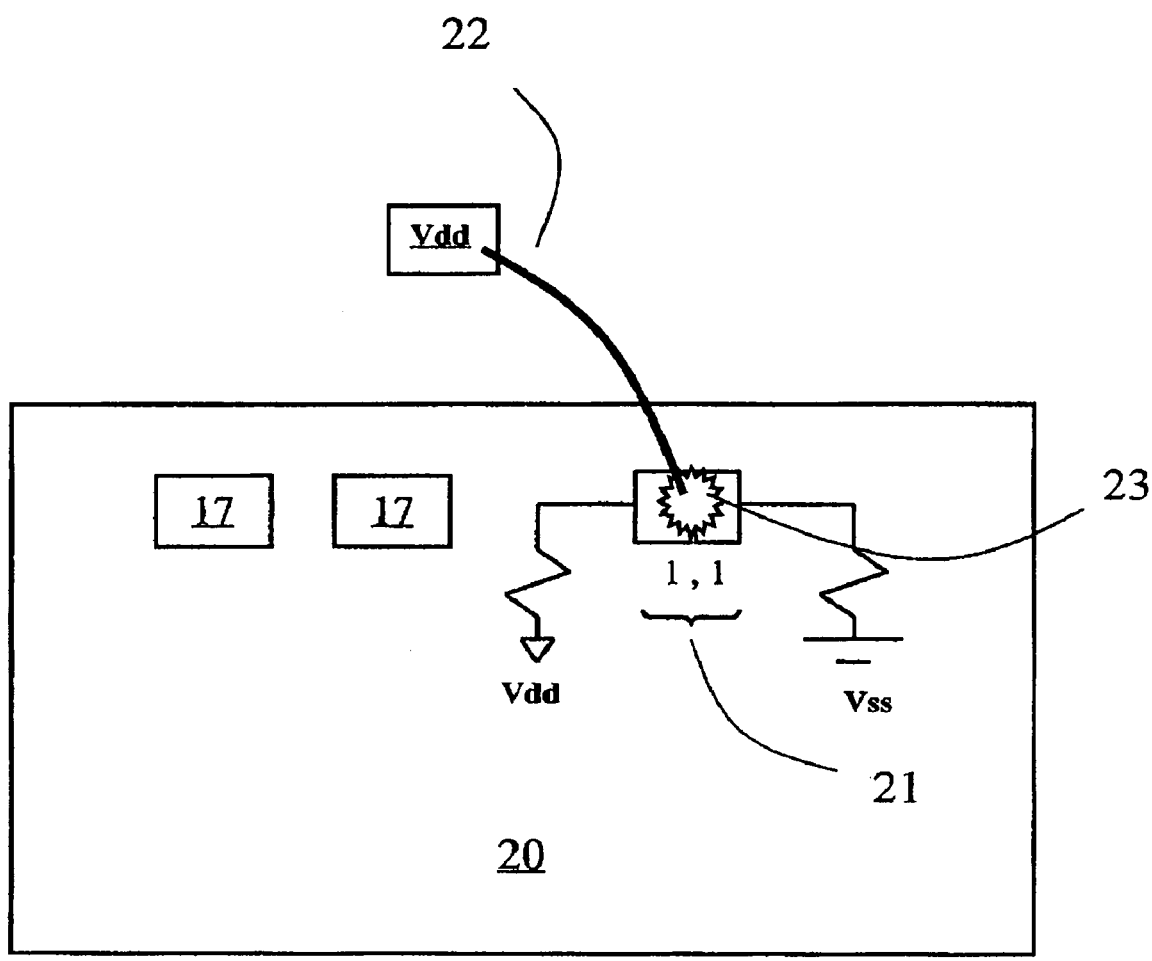
FIG. 3 shows the split control pad of the present invention to preset to (1,1) by bonding to Vdd.

FIG. 3 shows a second embodiment of the present invention. In this configuration, the split control pad 21 is bonded through wire 22 to a voltage source Vdd, the bonding bump 23 covers both sections. Then both L and R sections of the split control pad 21 are forced to maintain a same voltage Vdd. Thus the two sections of the split control pad 21 are impressed with logical word "1,1". This status is denoted as S1, Selection 1 in Table 1B.

Figure 4:
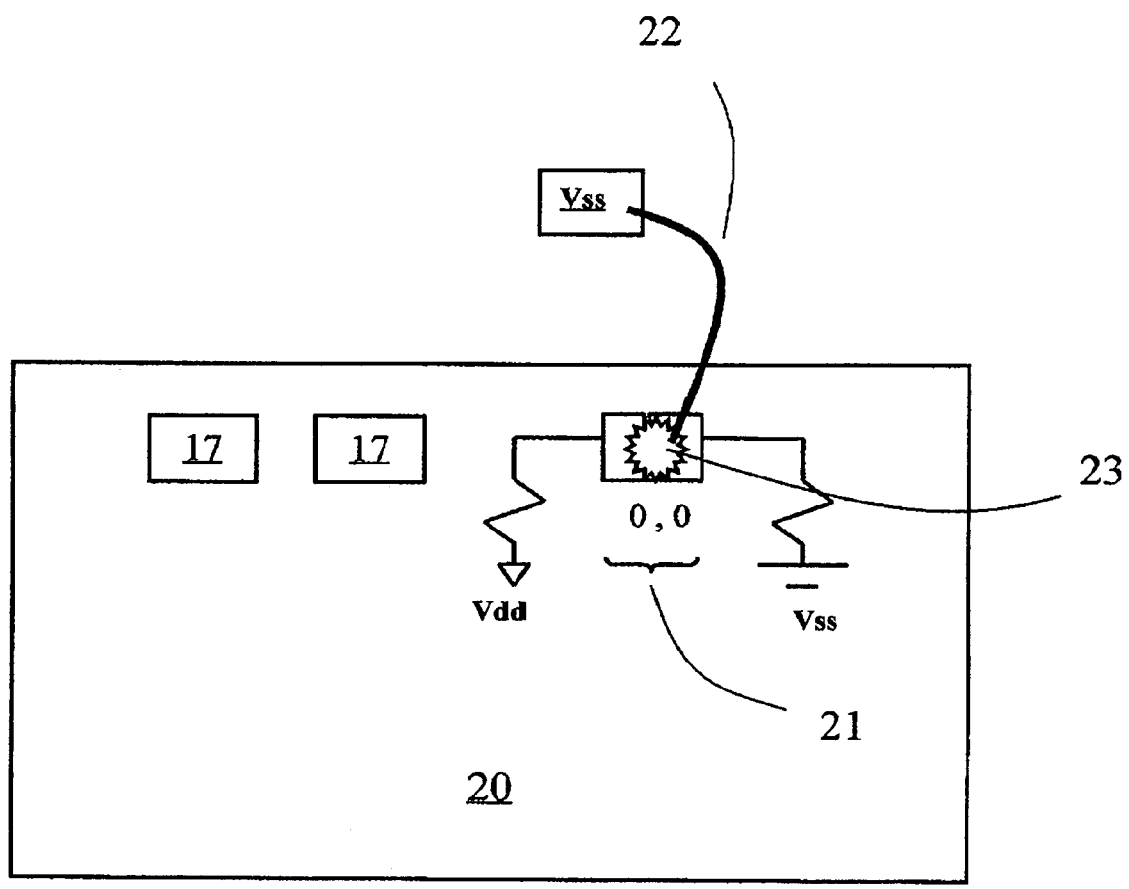
FIG. 4 shows the split control pad of the present invention to preset to (0,0) by bonding to Vss.

FIG. 4 shows a third embodiment of the present invention. In this configuration, the split control pad 21 is bonded through wire 22 to a voltage source Vss, the bonding bump 23 covers both sections. Then, both sections of the split control pad 21 are forced to maintain a same voltage Vss. Thus, the two sections of the split control pad 21 are impressed with a logical word "0,0". This status is denoted as S0, Selection 2 in Table 1B.

More logic word combinations can be obtained by using more than one split control pads. Table 2 shows possible logic word combinations of two 2-section split control pads, Split Pad 1 and Split Pad 2, combination. For each status of Split Pad 1, there can be three status of Split Pad 2, as shown in Table 2 with a total of 9 different status. In this Table 2, L, R represent the left section and right section respectively. The control pad first decodes "0,0" as S0; "1,1" as S1; "1,0" as S2 as defined in Table 1B. Then "S0, S0" is decoded as T0; "S0, S1" as T1; "S0, S2 " as T2; "S1,S0" as T3; "S1,S1" as T4; "S1,S2" as T5; "S2,S0" as T6; "S2,S1" as T7; and "S2,S2" as T8.

In FIGS. 2, 3 and 4, the control pad is split into two sections. The embodiments can be extended to split the control pad into more than two sections, each section connected to a different voltage source through a resistor.

While the embodiments of the invention have been described, it will be apparent to those skilled in the art that various modifications can be made without departing from the spirit of the invention. Such modifications are all within the scope of this invention.

The invention claimed is:

1. A split control pad for supplying multiple control signals, comprising:
   a control pad on an integrated circuit (IC) having at least two split sections, wherein one of said section couples to a positive supply voltage Vdd through a first resistance to represent logical "1", and another one of said sections couples to a negative supply voltage Vss through a second resistance to represent logical "0", so that the split sections yields signal "1,0" or "0,1" to the IC as a default when the split sections have no external connections.

2. The split control pad as described in claim 1, wherein there are two said split sections.

3. The split control pad as described in claim 2, wherein said split sections are further bonding to a positive supply voltage Vdd and the bonding unifies the two sections, so that the split sections yield signal "1,1" to the IC.

4. The split control pad as described in claim 2, wherein said split sections is further bonding to a negative supply voltage Vss and the bonding unifies the two sections, so that the split sections yields signal "0,0" to the IC.

5. The split control pad as described in claim 2, further comprising one more split control pad to yield nine possible status of output.

* * * * *